US012572041B2

(12) United States Patent　　(10) Patent No.:　US 12,572,041 B2
Shin et al.　　(45) Date of Patent:　Mar. 10, 2026

(54) DISPLAY DEVICE

(71) Applicant: LG Display Co., Ltd., Seoul (KR)

(72) Inventors: Youngchul Shin, Paju-si (KR); Boa Jin, Paju-si (KR); KyungMi Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/658,461

(22) Filed: May 8, 2024

(65) Prior Publication Data

US 2025/0208465 A1　　Jun. 26, 2025

(30) Foreign Application Priority Data

Dec. 22, 2023　　(KR) ........................ 10-2023-0190060

(51) Int. Cl.
G02F 1/1335　　(2006.01)
G02F 1/1333　　(2006.01)
H10K 59/12　　(2023.01)
H10K 59/50　　(2023.01)

(52) U.S. Cl.
CPC .. G02F 1/133543 (2021.01); G02F 1/133331 (2021.01); H10K 59/12 (2023.02); H10K 59/50 (2023.02)

(58) Field of Classification Search
None
See application file for complete search history.

(56) References Cited

U.S. PATENT DOCUMENTS

| | | | | |
|---|---|---|---|---|
| 2003/0193709 A1* | 10/2003 | Mallya | ................ | G02F 1/13718 |
| | | | | 359/245 |
| 2019/0072806 A1* | 3/2019 | Zhang | .................. | G04G 9/0041 |
| 2019/0353949 A1* | 11/2019 | Wang | .................. | G02F 1/13718 |
| 2023/0200117 A1 | 6/2023 | Park et al. | | |
| 2024/0345427 A1* | 10/2024 | Deng | ..................... | G02F 1/1334 |
| 2025/0035999 A1* | 1/2025 | Yoshida | .................. | G02F 1/137 |

FOREIGN PATENT DOCUMENTS

| | | |
|---|---|---|
| KR | 10-2016-0002350 A | 1/2016 |
| KR | 10-2019-0056043 A | 5/2019 |
| KR | 10-2021-0012419 A | 2/2021 |
| KR | 10-2023-0095657 A | 6/2023 |

* cited by examiner

*Primary Examiner* — Richard H Kim
(74) *Attorney, Agent, or Firm* — Fenwick & West LLP

(57)　　ABSTRACT

A display device comprises an optical layer disposed on a display unit and comprising a cholesteric liquid crystal, and a cover glass disposed on the optical layer, wherein the cover glass includes a flat portion and a curved portion disposed outside the flat portion, and the cholesteric liquid crystal overlaps the curved portion. According to the present invention, by forming the optical layer between the display unit and the cover glass, the variation in color of the flat portion and the curved portion of the cover glass according to the viewing angle can be minimized.

25 Claims, 6 Drawing Sheets

300: 310, 320      210: 211, 212
200: 210, 220      220: 221

300: 310, 320     210: 211
200: 210, 220     220: 221

DISPLAY DEVICE

CROSS-REFERENCE TO RELATED APPLICATIONS

This application claims the benefit of the Korean Patent Application No. 10-2023-0190060 filed on Dec. 22, 2023, which is hereby incorporated by reference as if fully set forth herein.

BACKGROUND

Field of the Invention

The present disclosure relates to a display device.

Description of the Related Art

A display device is widely used as a display screen of a notebook computer, a tablet computer, a smart phone, a portable display device, and a portable information device in addition to a display screen of a television or a monitor. With the advancement of technology, the display device may provide photographing or various sensing functions in addition to an image display function. Accordingly, the display device needs to include an electronic device such as a camera or a sensor.

Among the display devices, an organic light emitting display device is a self-emission type, and has advantages such as superior viewing angle and contrast ratio compared to a liquid crystal display (LCD), light weight and thinness are possible because no separate backlight is required, and power consumption is advantageous. In addition, the organic light emitting display device has the advantage of being able to drive DC low voltage, fast response speed, and especially low manufacturing cost.

Recently, in order to minimize a bezel area of the display device, a cover glass having a curvature in an edge area has been used. However, a luminance and light wavelength band change according to the viewing angle due to the curvature, and research is being conducted to solve this problem.

SUMMARY

The present disclosure has been made in view of the above problems and it is an object of the present disclosure to provide a display device with improved viewing angle characteristics of curved surfaces.

In accordance with an aspect of the present disclosure, the above and other objects can be accomplished by the provision of a display device comprising a display unit including a display area in which a plurality of sub-pixels are disposed and a non-display area surrounding the display area, an optical layer disposed on the display unit and comprising a cholesteric liquid crystal, and a cover glass disposed on the optical layer, wherein the cover glass includes a flat portion and a curved portion disposed outside the flat portion, and the cholesteric liquid crystal overlaps the curved portion.

In addition, in accordance with an aspect of the present disclosure, the above and other objects can be accomplished by the provision of a display device comprising a substrate including a display area in which a plurality of sub-pixels are disposed and a non-display area surrounding the display area, a light emitting device disposed on the substrate and disposed in each of the plurality of sub-pixels, an encapsulation layer disposed in the display area and the non-display area and covering the light emitting device, an optical layer disposed on the encapsulation layer, the optical layer including a first region and a second region having different characteristics from the first region, and a cover glass disposed on the optical layer, the cover glass including a flat portion and a curved portion, wherein the entire first region of the optical layer corresponds to the display area, and the second region of the optical layer includes a first portion corresponding to the display area and a second portion corresponding to the non-display area.

DETAILED DESCRIPTION OF THE DISCLOSURE

Figure 1:
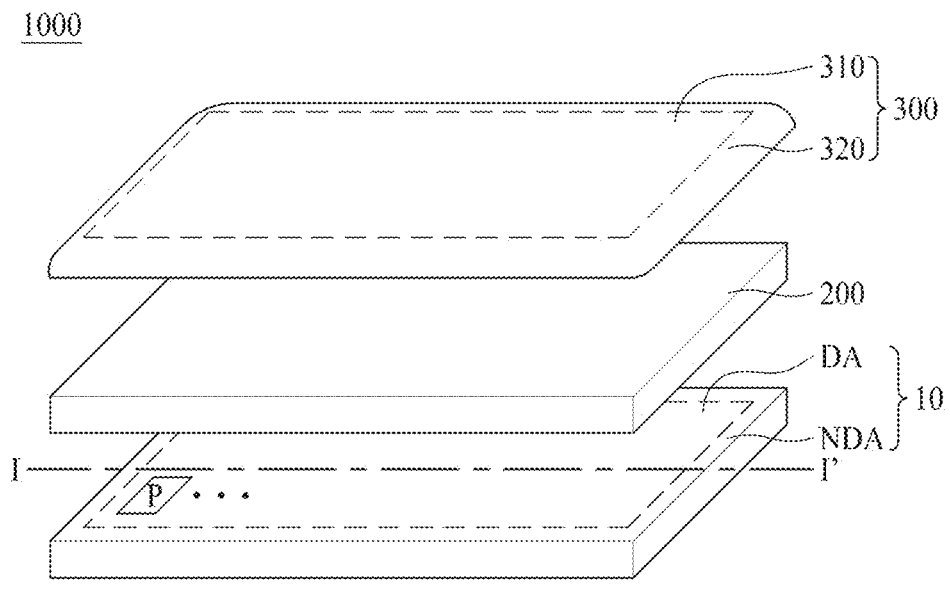
FIG. 1 is an exploded perspective view of a display device according to an embodiment of the present invention.

Advantages and features of the present disclosure and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete and will fully convey the scope of the present disclosure to those skilled in the art. Further, the present disclosure is only defined by scopes of claims.

A shape, a size, a ratio, an angle and a number disclosed in the drawings for describing embodiments of the present disclosure are merely an example and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have' and 'include' described in the present disclosure are used, another portion may be added unless 'only~' is used. The terms of a singular form may include plural forms unless referred to the contrary.

In construing an element, the element is construed as including an error band although there is no explicit description.

In describing a position relationship, for example, when the position relationship is described as 'upon~', 'above~', 'below~' and 'next to~', one or more portions may be disposed between two other portions unless 'just' or 'direct' is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other and may be variously inter-operated with each other and driven technically as those skilled in the art can sufficiently understand. The embodiments of the present disclosure may be carried out independently from each other or may be carried out together in a co-dependent relationship.

Hereinafter, the preferred embodiment of the present disclosure will be described in detail with reference to the accompanying drawings.

FIG. 1 is an exploded perspective view of a display device 1000 according to an embodiment of the present invention.

Referring to FIG. 1, the display device 1000 according to an embodiment of the present invention may include a display unit 10, an optical layer 200, and a cover glass 300.

The display unit 10 may emit light to display a screen. The display unit 10 may include a display area DA and a non-display area DNA surrounding the display area DA. The display area DA is an area in which an image may be displayed, and the non-display area NDA is an area in which an image is not displayed.

A plurality of sub-pixels SP and a plurality of signal lines for driving the plurality of sub-pixels SP may be disposed in the display area DA. The plurality of signal lines may include a plurality of data lines and a plurality of gate lines.

The optical layer 200 may be disposed on the display unit 10. The optical layer 200 may cover an upper surface of the display unit 10. Also, the optical layer 200 may absorb or reflect light emitted from the display unit 10. A detailed description thereof will be described later.

The cover glass 300 may be disposed on the optical layer 200. Since the cover glass 300 is configured to transmit light emitted from the display unit 10, the cover glass 300 may be formed of a transparent material. Although FIG. 1 illustrates that an area of a lower surface of the cover glass 300 is the same as an area of an upper surface of the optical layer 200, the present invention is not limited thereto. For example, the area of the lower surface of the cover glass 300 may be larger than the area of the upper surface of the optical layer 200. Accordingly, a portion of the lower surface of the cover glass 300 may be exposed to the outside. Alternatively, the cover glass 300 may cover a portion of a side surface of the optical layer 200 or the display unit 10, but is not limited thereto.

The cover glass 300 may include a flat portion 310 and a curved portion 320 surrounding the flat portion 310. An upper surface and a lower surface of the flat portion 310 may be flat. Also, an upper surface of the curved portion 320 may have a curvature, and a lower surface of the curved portion 320 may be flat. That is, a thickness of the curved portion 320 may decrease toward a direction away from the flat portion 310 from a boundary between the flat portion and the curved portions 310 and 320. That is, a thickness of the curved portion 320 may decrease toward an end of the cover glass 300. Accordingly, an edge of an upper surface of the cover glass 300 may be a curved surface.

Also, although FIG. 1 illustrates that the curved portion 320 surrounds all edges of the flat portion 310, it is not limited thereto. For example, the curved portion 320 may be disposed only in the outer regions of one side and the other side of the flat portion 310 that are not adjacent to each other.

Figure 2:
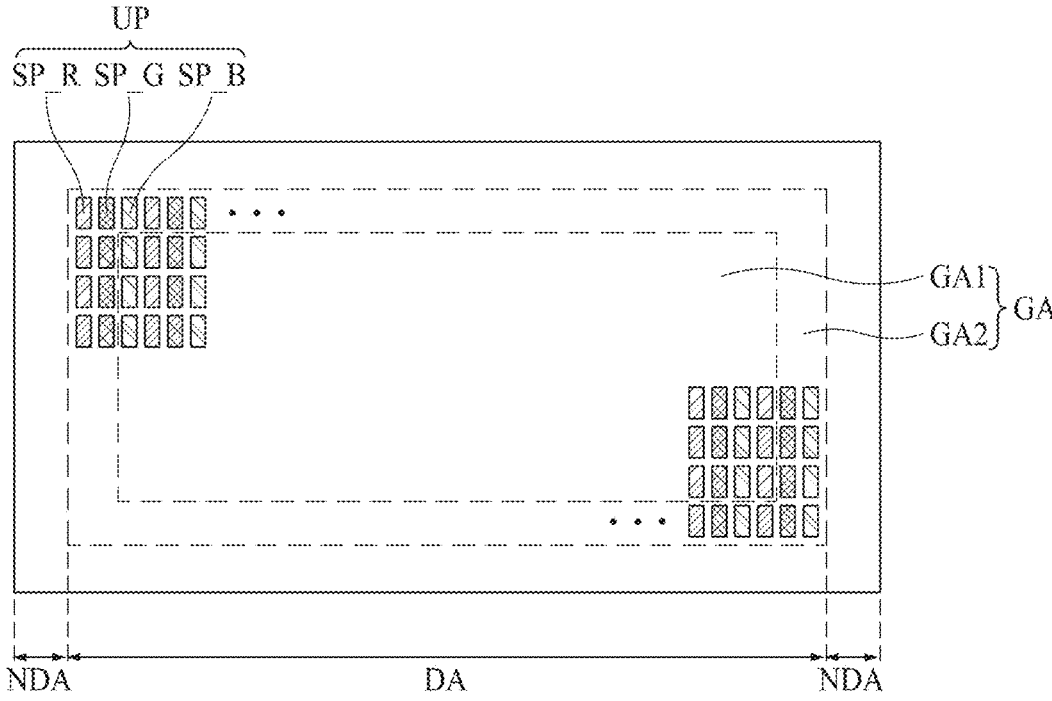
FIGS. 2 and 3 are plan views of a display device according to an embodiment of the present invention.
Figure 3:
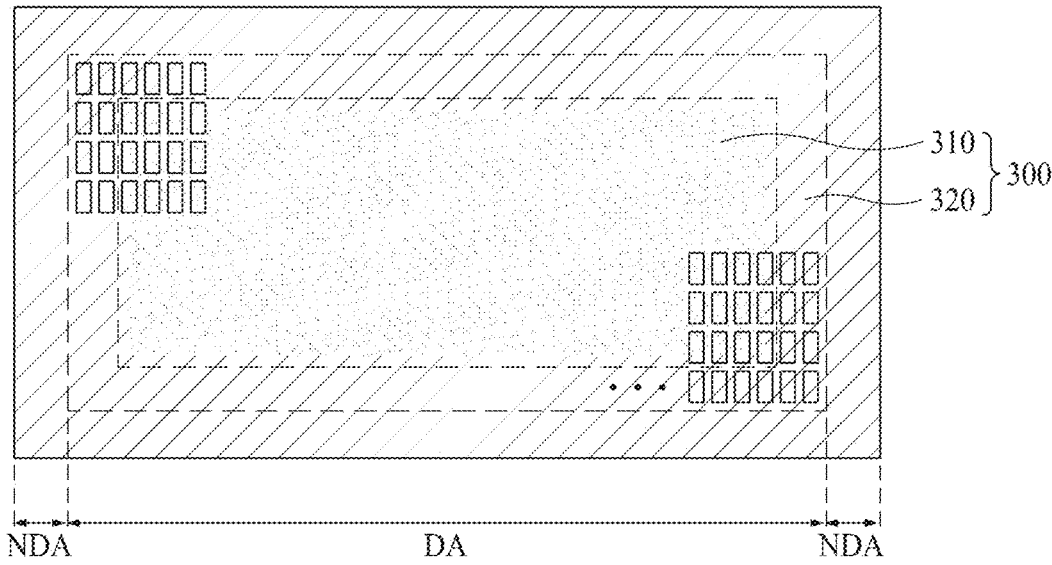

FIGS. 2 and 3 are plan views of the display device 1000 according to an embodiment of the present invention. FIG. 2 illustrates the display unit 10, and FIG. 3 illustrates a structure in which the cover glass 300 is disposed on the display unit 10 of FIG. 2.

Referring to FIG. 2, the display unit 10 may include a display area DA and a non-display area NDA surrounding the display area DA. A plurality of sub-pixels SP may be disposed in the display area DA. The plurality of sub-pixels SP may be disposed in a matrix form having a plurality of rows and columns.

The plurality of sub-pixels SP may include a plurality of red sub-pixels SP_R, a plurality of green sub-pixels SP_G, and a plurality of blue sub-pixels SP_B. The red sub-pixel SP_R may emit red light, the green sub-pixel SP_G may emit green light, and the blue sub-pixel SP_B may emit blue light. Although FIG. 2 illustrates a structure in which the red sub-pixel SP_R, the green sub-pixel SP_G, and the blue sub-pixel SP_B are sequentially arranged along a horizontal direction, it is not limited thereto. Also, the plurality of sub-pixels SP may further include a white sub-pixel emitting white light, but are not limited thereto.

In this case, the plurality of sub-pixels SP may be composed of a plurality of unit pixels UP including one red sub-pixel SP_R, one green sub-pixel SP_G, and one blue sub-pixel SP_B, which are sequentially formed.

Referring to FIG. 3, the cover glass 300 may cover an upper surface of the display unit 10. As described above, the cover glass 300 may include the flat portion 310 having a flat upper surface and the curved portion 320 surrounding the flat portion 310, and having a curved upper surface.

In this case, in the display area DA, an area in which sub-pixels SP overlapping the flat portion 310 of the cover glass 300 are disposed may be a first group area GA1, and an area in which sub-pixels SP overlapping the curved portion 320 of the cover glass 300 are disposed may be a second group area GA2. Since the curved portion 320 of the cover glass 300 surround the flat portion 310, the second group area GA2 may also surround the first group area GA1. Also, the second group area GA2 may include at least one-unit pixel UP, but is not limited thereto. Also, at least one sub-pixel SP may overlap a boundary area between the flat portion and the curved portions 310 and 320, but is not limited thereto.

Figure 4:
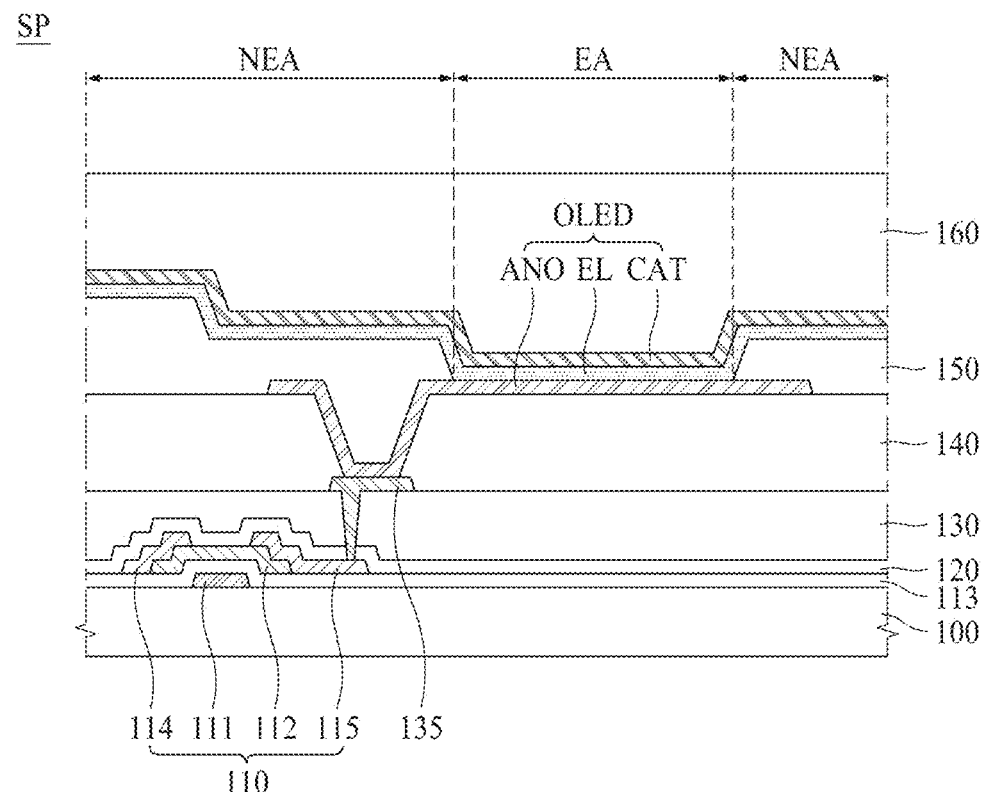
FIG. 4 is a cross-sectional view of a sub-pixel SP according to an embodiment of the present invention.

FIG. 4 is a cross-sectional view of a sub-pixel SP according to an embodiment of the present invention.

Referring to FIG. 4, one sub-pixel SP according to an embodiment of the present invention may include a substrate 100, a thin film transistor 110, a passivation layer 120, a first planarization layer 130, a connection electrode 135, a second planarization layer 140, a bank 150, an encapsulation layer 160, and a light emitting device OLED.

The substrate 100 may be formed of glass or plastic, but is not limited thereto. The display device according to an embodiment of the present invention may be configured in a top emission type in which the emitted light is emitted upward. Therefore, as the material of the substrate 100, not only a transparent material but also an opaque material may be used.

The thin film transistor 110 may be disposed on the substrate 100. The thin film transistor 110 may include a gate electrode 111, a semiconductor layer 112, a gate insulating layer 113, a source electrode 114, and a drain electrode 115.

The gate electrode 111 of the thin film transistor 110 may be disposed on the substrate 100. Also, the semiconductor layer 112 may be disposed on the gate electrode 111. The semiconductor layer 112 may include a poly-silicon semiconductor or an oxide semiconductor. In addition, when the semiconductor layer 112 includes an oxide semiconductor, at least one oxide of indium-gallium-zinc-oxide (IGZO), indium-zinc-oxide (IZO), indium-gallium-tin-oxide (IGTO), and indium-gallium-oxide (IGO) may be included.

To insulate the gate electrode 111 from the semiconductor layer 112, a gate insulating layer 113 may be disposed between the gate electrode 111 and the semiconductor layer 112. The gate insulating layer 113 may include a single layer of silicon nitride (SiNx) or silicon oxide (SiOx) or multiple layers thereof. Also, FIG. 4 illustrates a bottom gate structure in which a semiconductor layer 112 is disposed on a gate electrode 111, but is not limited thereto. For example, a top gate structure in which the gate electrode 111 is disposed on the semiconductor layer 112 may be used.

The source electrode 114 and the drain electrode 115 may be disposed on the semiconductor layer 112 while facing each other. Also, the passivation layer 120 may be disposed on the source electrode 114 and the drain electrode 115. A contact hole exposing a portion of the drain electrode 115 may be formed in the passivation layer 120. Also, the passivation layer 120 may be formed of an inorganic insulating material, such as silicon oxide (SiOx), silicon nitride (SiNx), silicon oxynitride (SiOxNy).

The first planarization layer 130 may be disposed on the thin film transistor 110, and the second planarization layer 140 may be disposed on the first planarization layer 130. The first and second planarization layers 130 and 140 may compensate for a step difference caused by the thin film transistor 110 to planarize an upper region of the thin film transistor 110. Furthermore, the first and second planarization layers 130 and 140 may be formed of an organic insulating material such as an acrylic resin, an epoxy resin, a phenolic resin, a polyamide resin, or a polyimide resin.

The light emitting device OLED may be disposed on the second planarization layer 140. The light emitting device OLED may include a first electrode ANO, a light emitting layer EL, and a second electrode CAT.

The first electrode ANO is disposed on the second planarization layer 140 and may function as an anode of the display device. The first electrode ANO may be electrically connected with the drain electrode 115 of the thin film transistor 110 through the connection electrode 135 disposed on the first planarization layer 130.

The first electrode ANO may include a transparent conductive material such as an indium tin oxide (ITO) or an indium zinc oxide (IZO). Alternatively, the first electrode ANO may include a metal material such as aluminum (Al), silver (Ag), copper (Cu), molybdenum (Mo), titanium (Ti), tungsten (W), or chromium (Cr), or an alloy thereof. Also, although illustrated as a single layer, the first electrode ANO may be formed of multiple layers.

The bank 150 may be disposed on the second planarization layer 140 and the first electrode ANO. The bank 150 may define an emitting area EA and a non-emitting area NEA. That is, the area in which the bank 150 is not disposed may become the emitting area EA, and the area in which the bank 150 is disposed may become the non-emitting area NEA.

The bank 150 may include an organic insulating material such as an acrylic resin, an epoxy resin, a phenolic resin, a polyamide resin, a polyimide resin, or the like. Alternatively, the bank 150 may include an inorganic insulating material such as silicon oxide (SiOx), silicon nitride (SiNx), silicon oxynitride (SiOxNy). Also, the bank 150 may include a black dye in order to absorb light incident from the outside.

The light emitting layer EL may be disposed on the first electrode ANO. The light emitting layer EL may also be disposed on the bank 150. That is, the light emitting layer EL may be disposed in the emitting area EA and the non-emitting area NEA.

The light emitting layer EL may include a hole transporting layer, an organic emission layer, and an electron transporting layer. In this case, when a voltage is applied to the first electrode ANO and the second electrode CAT, holes and electrons move to the organic emission layer through the hole transport layer and the electron transport layer, respectively, and may be combined with each other in the organic emission layer to emit light.

The second electrode CAT may be disposed on the light emitting layer EL. The second electrode CAT may function as a cathode of the display device. Like the light emitting Like the light emitting layer EL, the second electrode CAT may be disposed in the emitting area EA and the non-emitting area NEA.

Since the display device according to an embodiment of the present invention is configured in an upper light emitting method, the second electrode CAT may include a transparent conductive material such as ITO (Indium Tin Oxide) or IZO (Indium Zinc Oxide) to transmit light emitted from the light emitting layer EL upward.

The encapsulation layer 160 may be disposed on the light emitting device OLED. The encapsulation layer 160 may include an organic insulating material such as an acrylic resin, an epoxy resin, a phenolic resin, a polyamide resin, or a polyimide resin.

Figure 5:
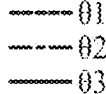
FIG. 5 shows in parts (a), (b), and (c) wavelength and luminance graphs according to a viewing angle of a sub-pixel in a first group area according to an embodiment of the present invention.
Figure 5:
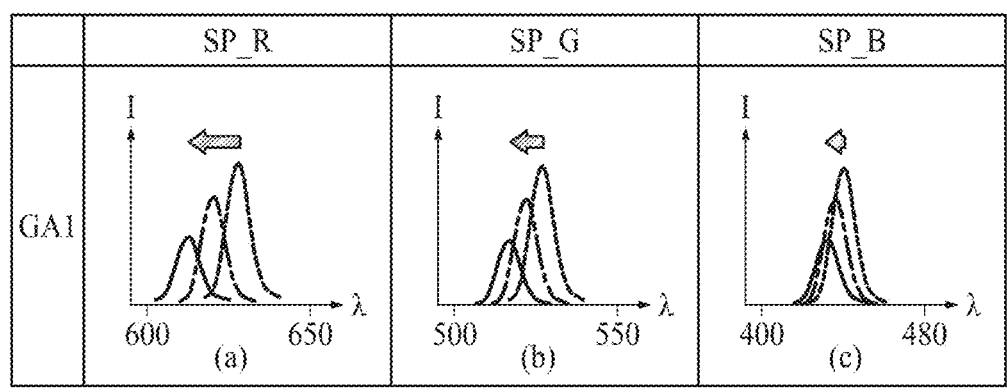

FIG. 5 shows in parts (a), (b), and (c) graphs of wavelength $\lambda$ and luminance I according to a viewing angle $\theta$ of the sub-pixel SP in the first group area GA1 according to an embodiment of the present invention. The luminance I shown in FIGS. 5A, 5B and 5C is a diagram illustrating luminance of light generated in the sub-pixel SP in the first group area GA1 and passing through the flat portion 310 of the cover glass 300.

FIG. 5 illustrates in parts (a), (b), and (c) a change in wavelength band according to the viewing angle $\theta$ of light emitted from the red, green, and blue sub-pixels SP_R, SP_G, and SP_B disposed in the first group area GA1 of the display area DA.

The viewing angle $\theta$ may be an angle between a normal line with respect to the substrate 100 and a viewing position of a user. The viewing angle $\theta$ may include a first viewing angle $\theta1$, a second viewing angle $\theta2$ and a third viewing angle $\theta3$. The second viewing angle $\theta2$ may be greater than the first viewing angle $\theta1$, and the third viewing angle $\theta3$ may be greater than the second viewing angle $\theta2$. Also, the third viewing angle $\theta3$ may be 60° or less. For example, the first viewing angle $\theta1$ may be 0°, the second viewing angle $\theta2$ may be 30°, and the third viewing angle $\theta3$ may be 45°. That is, the first viewing angle $\theta1$ may be a direction perpendicular to an upper surface of the substrate 100.

Referring to FIG. 5, part (a), the red sub-pixel SP_R may emit red light equal to or greater than about 600 nm and equal to or less than 650 nm. Referring to FIG. 5, part (b), the green sub-pixel SP_G may emit green light equal to or greater than about 500 nm and equal to or less than 550 nm.

Also, referring to FIG. 5, part (c), the blue sub-pixel SP_B may emit blue light equal to or greater than 400 nm and equal to or less than 480 nm.

Referring to FIG. 5, parts (a), (b), and (c), as the viewing angle gradually changes from the first viewing angle θ1 to the second viewing angle θ2, the luminance graphs of the red, green, and blue sub-pixels SP_R, SP_G, and SP_B may shift to the left. That is, as the viewing angle changes from the first viewing angle θ1 to the second viewing angle θ2, the wavelength ranges of the red, green, and blue sub-pixels SP_R, SP_G, and SP_B may shift to a relatively short wavelength region. Also, as the viewing angle changes from the first viewing angle θ1 to the second viewing angle θ2, the luminance I of the red, green, and blue sub-pixels SP_R, SP_G, and SP_B may decrease.

Also, as the viewing angle gradually changes from the second viewing angle θ2 to the third viewing angle θ3, the luminance graphs of the red, green, and blue sub-pixels SP_R, SP_G, and SP_B may shift to the left. That is, as the viewing angle gradually changes from the second viewing angle θ2 to the third viewing angle θ3, the wavelength ranges of the red, green, and blue sub-pixels SP_R, SP_G, and SP_B may shift to a relatively short wavelength region. Also, as the viewing angle gradually changes from the second viewing angle θ2 to the third viewing angle θ3, the luminance I of the red, green, and blue sub-pixels SP_R, SP_G, and SP_B may decrease.

That is, as a size of the viewing angle θ increases, the wavelength range of all sub-pixel SP may shift to the relatively short wavelength region. Also, as the size of the viewing angle θ increases, the luminance I of all sub-pixel SP may decrease.

In this case, ranges in which the wavelength band of each of the red, green, and blue sub-pixels SP_R, SP_G, and SP_B shifts to the short wavelength region may be different. Specifically, referring to FIG. 5, parts (a), (b), and (c), the variation in the wavelength band may be large in the order of the blue sub-pixel SP_B, the green sub-pixel SP_G, and the red sub-pixel SP_R. That is, the variation in the wavelength band of the red sub-pixel SP_R may be the largest and the variation in the wavelength band of the blue sub-pixel SP_B may be the smallest according to the viewing angle θ. Also, the variation in the wavelength band of the green sub-pixel SP_G may be between the variation in the wavelength band of the red sub-pixel SP_R and the variation in the wavelength band of the blue sub-pixel SP_B.

When the variation in the wavelength band of each of the red, green, and blue sub-pixels SP_R, SP_G, and SP_B according to the viewing angle θ is similar, a balance of colors may be maintained even if the overall luminance decreases. However, as described above, the variation in the wavelength band of each of the red, green, and blue sub-pixels SP_R, SP_G, and SP_B according to the viewing angle θ may be different. Accordingly, as the viewing angle θ increases, the balance of red, green, and blue light is not maintained, and thus a difference in color may occur. For example, when the luminance of blue light is relatively small compared to red and green light, yellowish color may be implemented.

Figure 6:
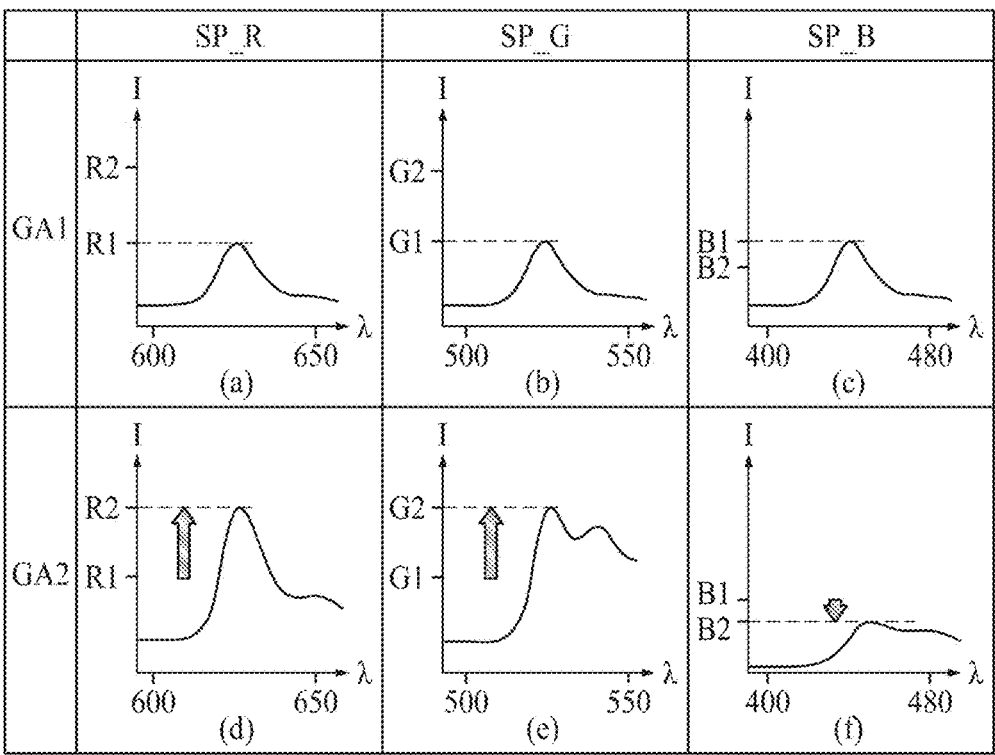
FIG. 6 shows in parts (a), (b), (c), (d), (e), and (f) luminance graphs of sub-pixels in a first group area and a second group area according to an embodiment of the present invention.

FIG. 6 shows in parts (a), (b), (c), (d), (e), and (f) luminance I graphs of the sub-pixels SP in the first and second group regions GA1 and GA2 according to an embodiment of the present invention. In this case, the reference viewing angle of the luminance I graph of FIG. 6, parts (a), (b), (c), (d), (e), and (f) may be a large angle compared to the viewing angle of the luminance I graph of FIG. 5, parts (a), (b), and (c). In this case, the large angle may be 60° or more and 80° or less.

FIG. 6, parts (a), (b), and (c) show the luminance I according to the wavelength λ of light that is generated by the red, green, and blue sub-pixels SP_R, SP_G, and SP_B disposed in the first group area GA1 of the display area DA and passes through the flat portion 310 of the cover glass 300.

Referring to FIG. 6, part (a), the red sub-pixel SP_R may emit red light equal to or greater than about 600 nm and equal to or less than 650 nm. Also, a value of a peak of the luminance I of the red light emitted from the red sub-pixel SP_R disposed in the first group area GA1 may be referred to as a first red luminance value R1.

Referring to FIG. 6, part (b), the green sub-pixel SP_G may emit green light equal to or greater than about 500 nm and equal to or less than 550 nm. Also, a value of a peak of the luminance I of the green light emitted from the green sub-pixel SP_G disposed in the first group area GA1 may be referred to as a first green luminance value G1.

Referring to FIG. 6, part (c), the blue sub-pixel SP_B may emit blue light equal to or greater than about 400 nm and equal to or less than 480 nm. Also, a value of a peak of the luminance I of blue light emitted from the blue sub-pixel SP_B disposed in the first group area GA1 may be referred to as a first blue luminance value B1.

As described above, light emitted from the sub-pixel SP in the first group area GA1 may pass through the flat portion 310 of the cover glass 300, and light emitted from the sub-pixel SP in the second group area GA2 may pass through the curved portion 320 of the cover glass 300. In this case, since the upper surface of the flat portion 310 and the upper surface of the curved portion 320 have different shapes, paths of light emitted from the sub-pixel SP in each of the first and second group areas GA1 and GA2 may be different.

Specifically, when the light generated in the first group area GA1 is emitted toward the flat portion 310 of the cover glass 300, total reflection may occur at the large angle. That is, some light is not emitted to the outside, but may be reflected toward the substrate 100 again. Accordingly, as described above in FIG. 5, parts (a), (b), and (c), when the viewing angle increases, the luminance of red, green, and blue light may decrease in the flat portion 310 of the cover glass 300.

On the other hand, when some of the light generated in the second group area GA2 is emitted toward the curved portion 320 of the cover glass 300, total reflection may not occur at the large angle. That is, even at the large angle, some of the light generated in the second group area GA2 may pass through the curved portion 320 of the cover glass 300 and be emitted to the outside. Accordingly, the luminance of a specific wavelength band may increase in the curved portion 320 of the cover glass 300. Accordingly, the luminance I graphs of the sub-pixel SP in the first group area GA1 and the sub-pixel SP in the second group area GA2 may be different from each other.

In detail, FIG. 6, parts (d), (e), and (f) illustrate the luminance I according to the wavelength 2 of light that is generated by the red, green, and blue sub-pixels SP_R, SP_G, and SP_B disposed in the second group area GA2 of the display area DA and passes through the curved portion 320 of the cover glass 300.

Referring to FIG. 6, part (d), a value of a peak of the luminance I of red light emitted from the red sub-pixel SP_R of the second group area GA2 may be referred to as a second red luminance value R2. In this case, the second red luminance value R2 may be greater than the first red luminance value R1.

Referring to FIG. 6, part (e), a value of a peak of the luminance I of green light emitted from the green sub-pixel SP_G of the second group area GA2 may be referred to as a second green luminance value G2. In this case, the second green luminance value G2 may be greater than the first green luminance value G1.

Referring to FIG. 6, part (f), a value of a peak of the luminance I of blue light emitted from the blue sub-pixel SP_B of the second group area GA2 may be referred to as a second blue luminance value B2. In this case, the second blue luminance value B2 may be smaller than the first blue luminance value B1.

That is, when the viewing angle is the large angle, the luminance of red and green light may increase and the luminance of blue light may decrease in the second group area GA2 compared to the first group area GA1. Accordingly, when the viewing angle is the large angle, a difference in color may also occur in the second group area GA2. Specifically, when the viewing angle is the large angle, a yellowish color may be implemented in the curved portion 320 of the cover glass 300 while having a higher luminance than the light of the flat portion 310 of the cover glass 300.

In order to improve the variation of color described above in FIGS. 5 and 6, the present invention discloses the display device 1000 including the optical layer 200. This will be described with reference to FIG. 7.

Figure 7:
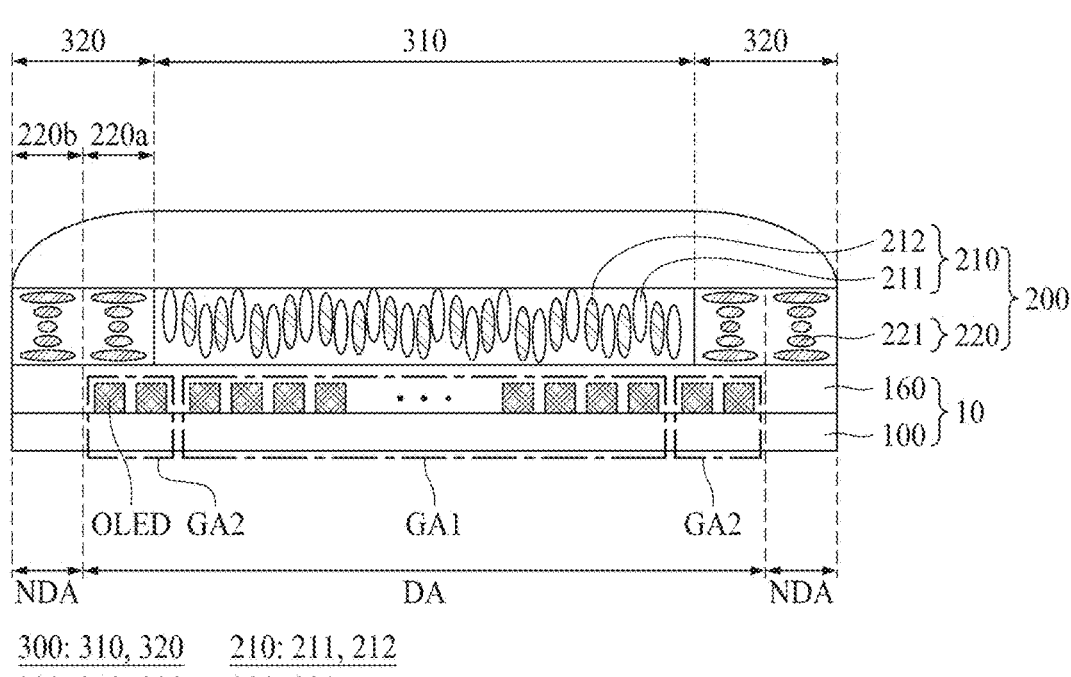
FIG. 7 is a cross-sectional view of a display device according to an embodiment of the present invention.

FIG. 7 is a cross-sectional view of the display device 1000 according to an embodiment of the present invention. As described above in FIG. 1, the display device 1000 may have a structure in which the display unit 10, the optical layer 200, and the cover glass 300 are sequentially disposed.

As described above, the display unit 10 may include the display area DA and the non-display area NDA surrounding the display area DA. Also, the plurality of sub-pixels SP may be disposed in the display area DA.

As described above in FIG. 4, each of the plurality of sub-pixels SP includes the light emitting device OLED disposed on the substrate 100, and the encapsulation layer 160 may cover the light emitting device OLED. In FIG. 7, a detailed structure of each sub-pixel SP will be omitted.

In this case, the substrate 100 and the encapsulation layer 160 may be disposed in both the display area DA and the non-display area NDA, and the light emitting device OLED of each sub-pixel SP may be disposed in the display area DA. Also, the light emitting device OLED of each sub-pixel SP may be spaced apart from each other by a bank (not shown).

The light emitting devices OLED of the plurality of sub-pixels SP may be disposed in each of the first and second group areas GA1 and GA2. FIG. 7 illustrates that two light emitting devices OLED are disposed in one side and the other side of the first group area GA1, respectively, but the present invention is not limited thereto.

The cover glass 300 may be disposed on the display unit 10. Since the cover glass 300 transmits light emitted from the display unit 10, the cover glass 300 may be formed of a transparent material. The cover glass 300 may include the flat portion 310 and a curved portion surrounding the flat portion 310. The upper and lower surfaces of the flat portion 310 may be flat. Also, the upper surface of the curved portion 320 may have the curvature, and the lower surface of the curved portion 320 may be flat.

The flat portion 310 of the cover glass 300 may cover the entire first group area GA1 of the display unit 10. Also, the area of the flat portion 310 of the cover glass 300 may be larger than the area of the first group area GA1 of the display unit 10.

The curved portion 320 of the cover glass 300 may cover the second group area GA2 and the non-display area NDA of the display unit 10. The curved portion 320 of the cover glass 300 may cover the entire second group area GA2 or only a partial area of the second group area GA2. For example, in the second group area GA2, at least one light emitting device OLED may be disposed in a boundary area between the flat portion 310 and the curved portion 320.

The optical layer 200 may be disposed between the display unit 10 and the cover glass 300. The optical layer 200 may cover the entire upper surface of the display unit 10. Also, the cover glass 300 may cover the entire upper surface of the optical layer 200.

The optical layer 200 may include a first region 210 and a second region 220 surrounding the first region 210.

The first region 210 of the optical layer 200 may correspond to the flat portion 310 of the cover glass 300. An area of an upper surface of the first region 210 of the optical layer 200 may be the same as the area of the lower surface of the flat portion 310 of the cover glass 300. That is, since the flat portion 310 overlaps the entire first group area GA1 of the display unit 10, the first region 210 may also overlap the entire first group area GA1 of the display unit 10. Also, when the area of the flat portion 310 is larger than the area of the first group area GA1 of the display unit 10, the area of the first region 210 may also be larger than the area of the first group area GA1 of the display unit 10. That is, the sub-pixel SP of the first group area GA1 may overlap both the first region 210 of the optical layer 200 and the flat portion 310 of the cover glass 300.

The first region 210 of the optical layer 200 may include a liquid crystal material 211 and a dichroic dye 212. The liquid crystal material 211 may be a liquid crystal material including a polymerizable end group. For example, the liquid crystal material 211 may include a mesogen expressing liquid crystal properties and the polymerizable end group. Also, the liquid crystal material 211 may be arranged in a direction perpendicular to the substrate 100. In this case, since the dichroic dye 212 is arranged in the same direction as the liquid crystal material 211, the dichroic dye 212 may also be arranged in a direction perpendicular to the substrate 100.

The dichroic dye 212 may absorb light in a specific wavelength band. For example, the dichroic dye 212 may absorb light in a wavelength band of 500 nm or more and 650 nm or less. That is, the dichroic dye 212 may absorb light in red and green wavelength bands.

Accordingly, when the light emitted from the plurality of light emitting devices OLED is directed toward the liquid crystal material 211, the light may pass through the liquid crystal material 211 and be emitted to the outside. Also, when the light emitted from the plurality of light emitting devices OLED is directed toward the dichroic dye 212, the light of a specific wavelength band may be absorbed by the dichroic dye 212, and the light of the remaining wavelength band may pass through the dichroic dye 212 and be emitted to the outside.

As described above, the liquid crystal material 211 and the dichroic dye 212 may be arranged in a direction perpendicular to the substrate 100. Accordingly, among light emitted from the plurality of light emitting devices OLED, light incident on the first region 210 of the optical layer 200 in a direction having a predetermined angle is more likely to direct toward the dichroic dye 212 than light incident on the first region 210 of the optical layer 200 in a direction perpendicular to the first region 210. For example, light emitted from the plurality of light emitting devices OLED may be incident on the first region 210 in a direction having an angle of 60° or less.

That is, among the light emitted from the plurality of light emitting devices OLED, light incident on the first region 210 in a direction having a predetermined angle is more likely to be absorbed by the dichroic dye 212 than light incident on the first region 210 of the optical layer 200 in a vertical direction.

As described above in FIG. 5, as the viewing angle increases in the range from 0° to 60°, a difference in color may occur in the flat portion 310 of the cover glass 300. However, according to the present invention, by forming the optical layer 200 having the dichroic dye 212 in the region corresponding to the flat portion 310 of the cover glass 300, light incident on the first region 210 of the optical layer 200 in a direction having a predetermined angle may be absorbed. For example, in the first group area GA1, when the luminance of blue light is relatively small compared to that of red light and green light, the dichroic dye 212 may be formed to absorb red light and green light. Accordingly, the luminance of red and green light may be reduced, and thus the luminance of red, green light and blue light may be similar to each other. Accordingly, by maintaining the balance of red, green light, and blue light, the difference in color of the flat portion 310 according to the viewing angle may be minimized.

The second area 220 of the optical layer 200 may correspond to the curved portion 320 of the cover glass 300. An area of an upper surface of the second area 220 of the optical layer 200 may be the same as an area of a lower surface of the curved portion 320 of the cover glass 300. That is, since the curved portion 320 of the cover glass 300 covers the second group area GA2 and the non-display area NDA of the display unit 10, the second area 220 of the optical layer 200 may also cover the second group area GA2 and the non-display area NDA of the display unit 10.

The second region 220 of the optical layer 200 may include a first portion 220a overlapping the second group area GA2 and a second portion 220b overlapping the non-display region NDA. Also, when the curved portion 320 of the cover glass 300 covers the entire second group area GA2, the first portion 220a of the second region 220 of the optical layer 200 may also cover the entire second group area GA2. Alternatively, when the curved portion 320 of the cover glass 300 covers only a partial region of the second group region GA2, the first portion 220a of the second region 220 of the optical layer 200 may also cover only a partial region of the second group area GA2. That is, in the second group area GA2, at least one light emitting device OLED may overlap both a boundary region between the flat portion 310 and the curved portions 320 and a boundary region between the first region 210 and the second regions 220.

The second region 220 of the optical layer 200 may include a cholesteric liquid crystal 221. The cholesteric liquid crystal 221 may be distributed in both the first and second portions 220a and 220b of the second region 220. The cholesteric liquid crystal 221 may have a spiral structure in which the optical axes of liquid crystal molecules of each layer are aligned to deviate from the optical axes of liquid crystal molecules of adjacent layers. When liquid crystal molecules of the cholesteric liquid crystal 221 have a rod shape, the optical axis of the liquid crystal molecule may correspond to the major axis of the liquid crystal molecule, such that the optical axis and the absorption axis may be perpendicular to each other.

In this case, since the cholesteric liquid crystal 221 does not receive an electric field, the cholesteric liquid crystal 221 may be in a planar state. Accordingly, the cholesteric liquid crystal 221 may reflect light of a specific wavelength range.

Specifically, a reference wavelength range $\Delta\lambda_r$ of light reflected by the cholesteric liquid crystal 221 may be defined by Equation 1 below. In this case, the reference wavelength range $\Delta\lambda_r$ refers to a wavelength range of light reflected when light is vertically incident toward the cholesteric liquid crystal 221. That is, when light having a wavelength corresponding to the range of Equation 1 is vertically incident toward the cholesteric liquid crystal 221, the light may be reflected by the cholesteric liquid crystal 221.

$$\Delta\lambda_r = P\Delta n \qquad \text{Equation 1}$$

In this case, P may be a distance at which the optical axis of the liquid crystal molecule completes a 360° rotation in the cholesteric liquid crystal 221, that is, a pitch. Also, $\Delta n$ may be a difference between the refractive index of the cholesteric liquid crystal 221 with respect to the light polarized in parallel with the optical axis of the cholesteric liquid crystal 221 and the refractive index of the cholesteric liquid crystal 221 with respect to the light polarized perpendicular to the optical axis of the cholesteric liquid crystal 221.

Also, a center wavelength $\lambda_0$ of light reflected by the cholesteric liquid crystal 221 may be defined by Equation 2 below. The center wavelength $\lambda_0$ may be a center value of the reference wavelength range $\Delta\lambda_r$.

$$\lambda_0 = 0.5NP \qquad \text{Equation 2}$$

In this case, N may be the sum of the refractive index of the cholesteric liquid crystal 221 with respect to the light polarized parallel to the optical axis of the cholesteric liquid crystal 221 and the refractive index of the cholesteric liquid crystal 221 with respect to the light polarized perpendicular to the optical axis of the cholesteric liquid crystal 221.

That is, the cholesteric liquid crystal 221 may adjust the center wavelength $\lambda_0$ and the reference wavelength range $\Delta\lambda_r$ by adjusting the pitch P.

In this case, since the cholesteric liquid crystal 221 has the spiral structure, the reflection wavelength range may change according to an angle of incident light. That is, as the viewing angle increases, the reflection wavelength range of the cholesteric liquid crystal 221 may change.

In detail, when the viewing angle is the large angle equal to or greater than 60° and equal to or less than 80°, the reflection wavelength range of the cholesteric liquid crystal 221 may shift to a relatively short wavelength region, compared to the reference wavelength range $\Delta\lambda_r$. For example, the center wavelength $\lambda_0$ of the cholesteric liquid crystal 221 may be about 750 nm. That is, the reference wavelength range $\Delta\lambda_r$ of the cholesteric liquid crystal 221 may be an infrared region. In this case, when the viewing angle is the large angle, the reflection wavelength range of the cholesteric liquid crystal 221 may shift to a region equal to or greater than 500 nm and equal to or less than 650 nm. That is, when the viewing angle is a large angle, the cholesteric liquid crystal 221 may reflect light of red and green wavelength bands. Light reflected by the cholesteric liquid crystal 221 may be emitted toward the substrate 100.

As described above in FIG. 6, when the viewing angle is the large angle, a yellowish color may be implemented on the curved portion 320 of the cover glass 300. However, according to the present invention, by forming the optical layer 200 having the cholesteric liquid crystal 221 in the region corresponding to the curved portion 320 of the cover glass 300, light incident on the second region 220 of the optical layer 200 from the display unit 10 may be reflected. In particular, red and green light incident on the second region 220 of the optical layer 200 from the display unit 10 may be reflected in the large angle direction of 60° or more and 80° or less. Accordingly, the luminance of red and green light may be reduced, and thus the luminance of red, green and blue light may be similar to each other. Accordingly, by maintaining the balance of red, green, and blue light, the difference in color of the curved portion 320 according to the viewing angle may be minimized.

Furthermore, since the reference wavelength range $\Delta\lambda_r$ of the cholesteric liquid crystal 221 is the infrared region, light in the visible light region incident on the cholesteric liquid crystal 221 from the display unit 10 in the vertical direction and at a small angle may be transmitted. Accordingly, the luminance of light directed to the vertical direction and at the small angle may not be affected.

Figure 8:
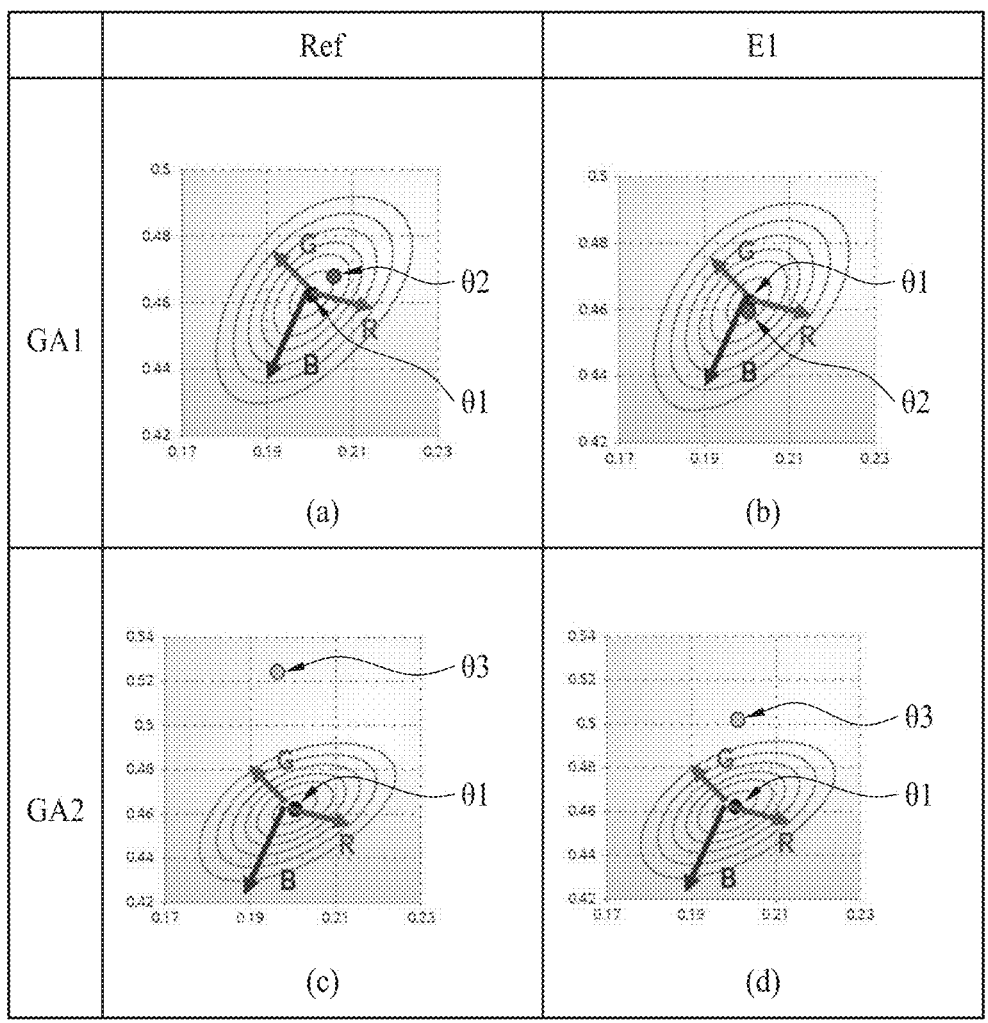
FIG. 8 shows in parts (a), (b), (c), and (d) graphs showing variation in color according to viewing angles of sub-pixels in a first group area and a second group area according to an embodiment of the present invention.

FIG. 8, parts (a) to (d) are graphs showing variation in color according to the viewing angle θ of the sub-pixel SP in the first and second group areas GA1 and GA2 according to an embodiment of the present invention. Referring to FIG. 8, parts (a) to (d), an origin may be in a state in which balance of red, green, and blue light is maintained.

When a dot shifts from the origin to a red direction (R), it means that the luminance of red light is relatively higher than that of green and blue light in the display device. In addition, when the dot shifts from the origin to the green direction (G), it means that the luminance of green light is relatively higher than that of red and blue light in the display device. In addition, when the dot shifts from the origin to the blue direction (B), it means that the luminance of blue light is relatively higher than that of red and green light in the display device.

In this case, Ref is a structure in which the cover glass 300 is directly disposed on the display unit 10, and E1 is the structure in which the optical layer 200 is disposed between the display unit 10 and the cover glass 300 described above in FIG. 7.

FIG. 8, parts (a) and (b) illustrate the variation in color of light generated by the sub-pixel SP in the first group area GA1 and passing through the flat portion 310 of the cover glass 300. The first viewing angle θ1 may be 0°, and the second viewing angle θ2 may be greater than the first viewing angle θ1. For example, the second viewing angle θ2 may be 45°.

At the first viewing angle θ1, since the dot of FIG. 8, parts (a) and (b) are at the origin, the balance of color may be maintained.

At the second viewing angle θ2, the dot of FIG. 8, part (a) may shift between red and green directions R and G. Accordingly, at the second viewing angle θ2, the structure of Ref may have relatively higher luminance of red and green light than that of blue light. On the other hand, at the second viewing angle θ2, the dot of FIG. 8, part (b) may be closer to the origin than the dot of FIG. 8, part (a). Accordingly, compared to the structure of Ref, even if the viewing angle increases in the first group area GA1, the structure of E1 including the optical layer 200 can minimize the variation in color.

FIG. 8, parts (c) and (d) show the variation in color of light generated by the sub-pixel SP in the second group area GA2 and passing through the curved portion 320 of the cover glass 300. The first viewing angle θ1 may be 0°, and the third viewing angle θ3 may be greater than the second viewing angle θ2. For example, the third viewing angle θ3 may be 75°.

At the first viewing angle θ1, the dot of FIG. 8, parts (c) and (d) maintains the position of the origin, so that balance of color may be maintained.

At the third viewing angle θ3, the dot of FIG. 8, part (c) may shift between red and green directions R and G. Accordingly, at the third viewing angle θ3, the structure of Ref may have relatively higher luminance of red and green light than that of blue light. Also, a range in which the dot of the third viewing angle θ3 in FIG. 8, part (c) is shifted from the origin may be greater than a range in which the dot of the second viewing angle θ2 is shifted from the origin in FIG. 8, part (a). That is, the variation in color may be greater in the second group area GA2 than in the first group area GA1.

On the other hand, at the third viewing angle θ3, the dot of FIG. 8, part (d) may be closer to the origin than the dot of FIG. 8C. Accordingly, compared to the structure of Ref, even if the viewing angle increases in the second group area GA2, the structure of E1 including the optical layer 200 can minimize the variation in color.

Accordingly, according to the present invention, by forming the optical layer 200 between the display unit 10 and the cover glass 300 having the flat portion 310 and the curved portion 320, the variation in color of the flat portion 310 and the curved portion 320 can be minimized.

Figure 9:
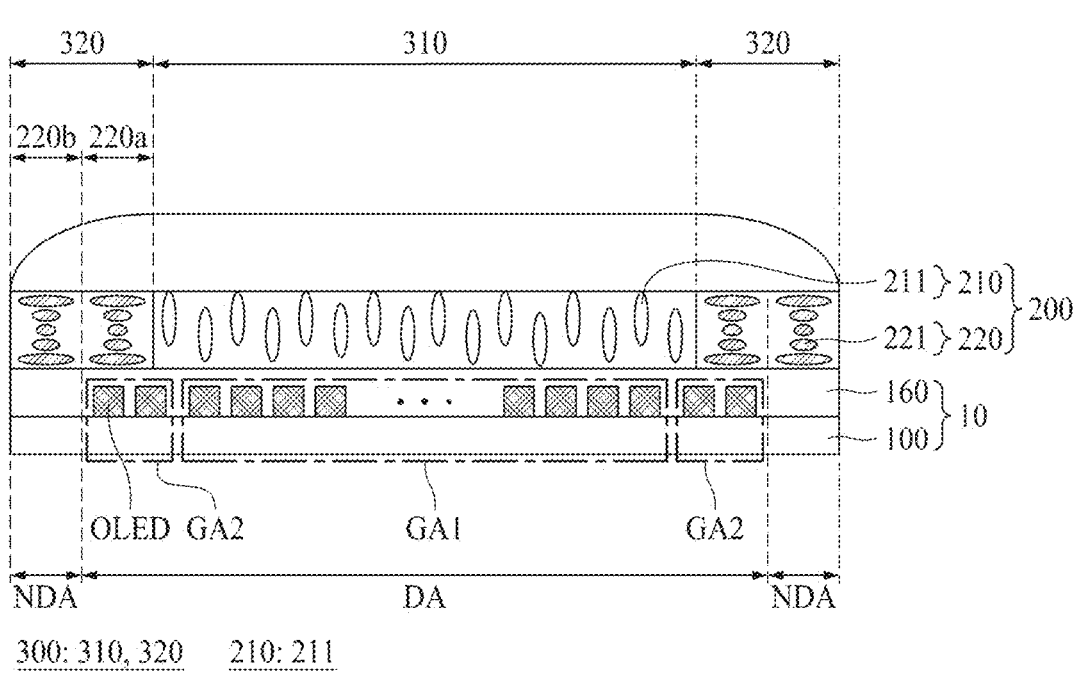
FIG. 9 is a cross-sectional view of a display device according to another embodiment of the present invention.

FIG. 9 is a cross-sectional view of a display device according to another embodiment of the present invention.

Compared with FIG. 7, FIG. 9 discloses a substantially same structure except for the structure of the optical layer 200. Accordingly, the same reference numerals are used for the components that are the same as those of the display device 1000 shown in FIG. 7, and repeated descriptions are omitted.

Referring to FIG. 9, the optical layer 200 may include a first region 201 and a second region 220. In this case, the first region 210 of the optical layer 200 of FIG. 7 includes the liquid crystal material 211 and the dichroic dye 212, whereas the first region 210 of the optical layer 200 of FIG. 9 may include only the liquid crystal material 211.

In the embodiment of FIG. 7, a portion of the light emitted from the first group area GA1 may be absorbed by the dichroic dye 212, and only the unabsorbed light may be emitted to the flat portion 310 of the cover glass 300. On the other hand, in the embodiment of FIG. 9, all the light emitted from the first group area GA1 may be emitted to the flat portion 310 of the cover glass 300. Accordingly, the overall reduction in the luminance of the flat portion 310 of the cover glass 300 may be minimized.

It will be apparent to those skilled in the art that the present disclosure described above is not limited by the above-described embodiments and the accompanying drawings and that various substitutions, modifications and variations can be made in the present disclosure without departing from the spirit or scope of the disclosures. Consequently, the scope of the present disclosure is defined by the accompanying claims and it is intended that all variations or modifications derived from the meaning, scope and equivalent concept of the claims fall within the scope of the present disclosure.

What is claimed is:

1. A display device comprising:
a display unit including a display area in which a plurality of sub-pixels are disposed and a non-display area surrounding the display area;
an optical layer disposed on the display unit and comprising a cholesteric liquid crystal; and
a cover glass disposed on the optical layer,
wherein the cover glass includes a flat portion and a curved portion disposed outside the flat portion,
wherein the curved portion is disposed at an edge of the cover glass, and
wherein the cholesteric liquid crystal does not overlap the flat portion and overlaps the curved portion.

2. The display device of claim 1, wherein the cholesteric liquid crystal reflects light in an infrared region incident on the cholesteric liquid crystal from the display unit in a direction of a normal line perpendicular to a substrate of the display unit.

3. The display device of claim 2, wherein the cholesteric liquid crystal transmits light in an infrared region incident on the cholesteric liquid crystal from the display unit in a direction having an angle of 60° or more and 80° or less from the normal line.

4. The display device of claim 1, wherein the cholesteric liquid crystal transmits light in a visible light region incident on the cholesteric liquid crystal from the display unit in a direction of a normal line perpendicular to a substrate of the display unit.

5. The display device of claim 4, wherein the cholesteric liquid crystal transmits some of the light in a visible light region incident on the cholesteric liquid crystal from the display unit in a direction having an angle of 60° or more and 80° or less from the normal line, and reflects some of the remaining light in the visible light region incident on the cholesteric liquid crystal from the display unit in a direction having an angle of 60° or more and 80° or less from the normal line.

6. The display device of claim 5, wherein the cholesteric liquid crystal transmits blue light incident on the cholesteric liquid crystal from the display unit in a direction having an angle of 60° or more and 80° or less from the normal line, and reflects red and green light incident on the cholesteric liquid crystal from the display unit in the direction having an angle of 60° or more and 80° or less from the normal line.

7. The display device of claim 1, wherein the optical layer includes a first region and a second region disposed outside the first region, and the cholesteric liquid crystal is disposed in the second region.

8. The display device of claim 7, wherein the first region overlaps the flat portion, and the second region overlaps the curved portion.

9. The display device of claim 8, wherein an area of an upper surface of the first region is the same as an area of a lower surface of the flat portion, and an area of an upper surface of the second area is the same as an area of a lower surface of the curved portion.

10. The display device of claim 7, wherein the second region includes a first portion overlapping the display area and a second portion overlapping the non-display region.

11. The display device of claim 7, wherein the first region includes a liquid crystal material arranged in a direction perpendicular to a substrate of the display unit.

12. The display device of claim 11, wherein the first region further includes a dichroic dye, and the dichroic dye is arranged in a direction perpendicular to the substrate.

13. The display device of claim 12, wherein the dichroic dye absorbs light in a red wavelength range and a green wavelength range.

14. The display device of claim 1, wherein the display area includes a first group area overlapping the flat portion and a second group area overlapping the curved portion, and the plurality of sub-pixels are disposed in each of the first and second group areas.

15. The display device of claim 14, wherein the flat portion covers the entire first group area.

16. The display device of claim 14, wherein the curved portion covers the entire non-display area and a part of the second group area.

17. The display device of claim 16, wherein at least one sub-pixel among the plurality of sub-pixels overlaps a boundary area between the flat portion and the curved portion.

18. The display device of claim 1, wherein a lower surface of the curved portion is flat, and an upper surface of the curved portion is curved.

19. The display device of claim 18, wherein a thickness of the curved portion decreases from a boundary area between the flat portion and the curved portion toward an end of the curved portion.

20. A display device comprising:
a substrate including a display area in which a plurality of sub-pixels are disposed and a non-display area surrounding the display area;
a light emitting device disposed on the substrate and disposed in each of the plurality of sub-pixels;
an encapsulation layer disposed in the display area and the non-display area and covering the light emitting device;
an optical layer disposed on the encapsulation layer, the optical layer including a first region and a second region having different characteristics from the first region; and
a cover glass disposed on the optical layer, the cover glass including a flat portion and a curved portion,
wherein the entire first region of the optical layer corresponds to the display area, and
the second region of the optical layer includes a first portion corresponding to the display area and a second portion corresponding to the non-display area.

21. The display device of claim 20, wherein the second region of the optical layer includes a cholesteric liquid crystal.

22. The display device of claim 20, wherein the first region of the optical layer includes a liquid crystal material arranged in a direction perpendicular to the substrate.

23. The display device of claim 22, wherein the first region of the optical layer further includes a dichroic dye arranged in a same direction as the liquid crystal material.

24. The display device of claim 20, wherein the first and second portions of the second region of the optical layer correspond to the curved portion of the cover glass.

25. The display device of claim 20, wherein the entire first region of the optical layer corresponds to the flat portion of the cover glass.

* * * * *